(12) United States Patent
Odake et al.

(10) Patent No.: US 6,872,624 B2
(45) Date of Patent: Mar. 29, 2005

(54) METHOD OF FABRICATING NONVOLATILE SEMICONDUCTOR MEMORY DEVICE

(75) Inventors: Yoshinori Odake, Hirakata (JP); Fumihiko Noro, Kyotanabe (JP); Takahiko Hashidzume, Takasuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 305 days.

(21) Appl. No.: 09/987,001

(22) Filed: Nov. 13, 2001

(65) Prior Publication Data

US 2002/0106859 A1 Aug. 8, 2002

(30) Foreign Application Priority Data

Feb. 8, 2001 (JP) .......................................... 2001-032573
Apr. 10, 2001 (JP) .......................................... 2001-110982

(51) Int. Cl.$^7$ ............................................ H01L 21/8247
(52) U.S. Cl. ........................................................ 438/264
(58) Field of Search ................................. 438/257–267

(56) References Cited

U.S. PATENT DOCUMENTS

| | | | | |
|---|---|---|---|---|
| 5,650,345 | A | * | 7/1997 | Ogura et al. ................. 438/593 |
| 6,030,869 | A | * | 2/2000 | Odake et al. ................ 438/266 |
| 6,228,717 | B1 | | 5/2001 | Hazama et al. |
| 6,232,183 | B1 | * | 5/2001 | Chen et al. .................. 438/264 |
| 6,248,627 | B1 | * | 6/2001 | Pham et al. ................. 438/257 |
| 6,268,624 | B1 | * | 7/2001 | Sobek et al. ................. 257/321 |
| 6,368,907 | B1 | * | 4/2002 | Doi et al. .................... 438/217 |
| 6,472,281 | B2 | * | 10/2002 | Doi et al. .................... 438/305 |
| 2003/0001195 | A1 | | 1/2003 | Mori |

FOREIGN PATENT DOCUMENTS

| | | |
|---|---|---|
| JP | 60-177678 | 9/1985 |
| JP | 05-251712 | 9/1993 |
| JP | 09-045799 | 2/1997 |
| JP | 10-209306 | 8/1998 |
| JP | 11-154711 | 6/1999 |
| JP | 11-289088 | 10/1999 |
| JP | 2000-150681 A | 5/2000 |
| JP | 2000-164736 A | 6/2000 |
| JP | 2001-015753 A | 1/2001 |

* cited by examiner

*Primary Examiner*—Richard A. Booth
(74) *Attorney, Agent, or Firm*—McDermott Will & Emery LLP

(57) ABSTRACT

A gate structure composed of a tunnel insulation film, a floating gate electrode, a capacitive insulation film and a control gate electrode is formed on a semiconductor substrate. Then, ion injection adjustment films that are in contact with the floating gate electrode at least on the side surfaces of the floating gate electrode are formed. After injecting impurity ions into the active region beside the gate structure in the semiconductor substrate while using the gate structure and the ion injection adjustment film as masks, the injected impurity ions are diffused thermally by performing heat treatment on the active region. Film thickness of the ion injection adjustment film is selected to a value to prevent the impurity ions from being injected into the tunnel insulation film and allows the impurity ions to reach lower portions of side end of the floating gate electrode in the active region as a result of diffusive scattering of impurity ions in the semiconductor substrate.

17 Claims, 8 Drawing Sheets

METHOD OF FABRICATING NONVOLATILE SEMICONDUCTOR MEMORY DEVICE

BACKGROUND OF THE INVENTION

The present invention relates to a method of fabricating a nonvolatile semiconductor memory device, and particularly relates to a method of fabricating an electrically erasable nonvolatile semiconductor memory device such as a large capacity EPROM device, EEPROM device and flash memory device.

Conventional fabrication methods of nonvolatile semiconductor memory devices are described in Japanese Patent Laid-Open Publication No. Hei 5-251712 (referred to as the first conventional example hereafter) or Japanese Patent Publication No. 2515715 (referred to as the second conventional example hereafter).

Conventional fabrication methods of nonvolatile semiconductor memory devices are explained below by referring to the figures.

FIG. 7A to FIG. 7C and FIG. 8 are cross sectional views which show a process sequence for conventional fabrication methods of nonvolatile semiconductor memory devices.

First, as shown in FIG. 7A, a p-type well 101a is formed on a semiconductor substrate 101 composed of p-type silicon, and then, an element isolation insulation film 102 (hereinafter referred to as insulation film) is selectively formed thereon. Then, a tunnel oxide film 103, a first poly-silicon film 104A, a capacitive insulation film 105 and a second poly-silicon film 106A that has about 300 nm film thickness are sequentially deposited on element forming regions on the semiconductor substrate 101.

Then, as shown in FIG. 7B, a plurality of gate structures 107 are obtained by applying patterning to the second poly-silicon film 106A, the capacitive insulation film 105, the first poly-silicon film 104A and the tunnel oxide film 103 to form a floating gate electrode 104B from the first poly-silicon layer 104A and a floating gate electrode 104B from the second poly-silicon film 106A.

Next, as shown in FIG. 7C, a thermal oxidation silicon film 110 is formed on the entire surface of the semiconductor substrate 101, which includes the insulation films 102 and the gate structures 107, by using a thermal oxidation method. Then, by using a CVD method, an insulative side wall spacer 111 composed of silicon oxide is formed on the side surfaces of the gate structures 107 by depositing a silicon oxide film on the entire surface of the thermal oxidation silicon film 110 and by performing anisotropic etching on the deposited silicon oxide film. Here, in the first conventional example, although the film thickness of the insulative side wall spacer 111 in the direction parallel to the substrate surface is not shown the film thickness must be at least 60 nm considering that a purpose is to prevent injected ions from entering the floating gate electrode 104B when arsenic ions are injected during later processes. In the second conventional example, the film thickness of the insulative side wall spacer is set to 500 nm.

Then, an ion injection layer 112A is formed by injecting arsenic ions into the p-type well 101a with an acceleration energy of 70 keV to 90 keV and dosage of about $1 \times 10^{16}$ cm$^{-2}$ by using each insulative side wall spacer 111 and each gate structure 107 as masks.

Next, as shown in FIG. 8, a source diffusion layer 112B and a drain diffusion layer 112C are formed by scattering arsenic ions in the ion injection layer 112A to lower portions of the side surface of the gate structure 107, that is, to end portions of the channel region by heat treating the semiconductor substrate 101.

In this way, according to the first conventional example and the second conventional example, because the thermal oxidation silicon film 110 formed on the side surfaces of the gate structure 107 and located beside the gate structure 107 are covered by the insulative side wall spacer 111 having a relatively large film thickness, arsenic ions hardly reach the thermal oxidation silicon film 110 on the side surfaces of the floating gate electrode 104B in particular. Consequently, because insulation performance of the thermal oxidation silicon film 110 on the side surfaces thereof is not lowered, data retention characteristic of memory cells can be improved.

However, in the above described conventional fabrication methods of nonvolatile semiconductor memory devices, if the film thickness of the insulative side wall spacer 111 is relatively large compared to that of the gate structure 107, the distance between the end portion of the ion injection layer 112A and the channel region is increased, so that an extended period of time is required for heat treatment to diffuse injected ions.

If, a MOS type semiconductor device that controls a nonvolatile semiconductor memory device or a micro controller that requires high speed operation or a MOS type semiconductor device for micro processor, is formed on the same substance, this extended period of time of heat treatment adversely affects various impurity concentrations such as channel impurity of a MOS type transistor.

Specifically, it is often the case that MOS type transistor gate electrodes that are used to construct a micro controller or a micro processor described above adopt dual gate or polycide gate structure. For this reason, if heat treatment is applied to dual gates or polycide gates for a long period of time, boron (B) ions may diffuse out of P$^+$ type poly-silicon which is used to construct the gates, and silicide may peel off or channel shorting effect of MOS type transistor may become exaggerated. Therefore, because the recent CMOS technology, which requires high performance and miniaturization, tries to reduce thermal hysteresis to as small as possible, if this trend continues, a problem is generated that it would be difficult to form miniaturized CMOS circuits with high performance and nonvolatile semiconductor memory devices on the same substrate.

Furthermore, although not shown in the figures, sufficiently thick film of an insulative side wall spacer 111 can not be formed on the side surface of insulation film 102, where the step portion of the insulation film 102 is smaller than the gate structure 107 on the semiconductor substrate 101. For this reason, a long period of heat diffusion process causes injected impurity ions to diffuse to the bottom portion of the insulation film 102 from both sides so that the insulation characteristic of the insulation film 102 is degraded. This generates a problem that the insulation film 102 cannot be miniaturized.

On the other hand, if a sufficiently thick film of an insulative side wall spacer 111 is made to form on the insulation film 102, then, the area of an ion injection layer 112A is reduced, thus, the gate width must be widened. In this case, also, it is difficult to miniaturize the insulation film 102.

Also, if the distance between the adjacent gate structures 107 is reduced in order to highly integrate a nonvolatile semiconductor memory device, an insulative side wall spacer 111 having a film thickness larger than one half of this distance, can not be implemented.

Furthermore, in the conventional fabrication method, if the film thickness of the insulative side wall spacer 111 is reduced too much, a problem is generated that injected arsenic ions cause damage to the thermal oxidation silicon film 110 formed on the side surfaces of the gate structure 107 and located beside the gate structure 107.

SUMMARY OF THE INVENTION

In view of the above described conventional problems, an objective of the present invention is to eliminate a long period of heat treatment required for the impurity diffusion process while suppressing damage to tunnel insulation films caused by injection of impurity ions when forming the source diffusion layer and the drain diffusion layer, which are located at side portions of the gate structure.

In order to accomplish the above described objective, a structure of the present invention is to form insulation films for ion injection adjustment at least on the side surfaces of the gate structure. These insulation films for ion injection adjustment prevent impurity ions from being injected into the tunnel insulation film, and have a film thickness which allows impurity ions to reach to the portion below the floating gate electrode by a short period of heat treatment as a result of diffused scattering of impurity ions to the semiconductor substrate.

Specifically, a method of fabricating a nonvolatile semiconductor memory device according to the present invention comprises: a first step of forming a gate structure on a semiconductor substrate, the gate structure comprising a tunnel insulation film being in contact with the semiconductor substrate, a floating gate electrode being in contact with the tunnel insulation film, a control gate electrode facing the floating gate with an intervening capacitive insulation film; a second step of forming ion injection adjustment films comprising an insulation film being in contact with the floating gate electrode at least on side surfaces of the floating gate electrode; a third step of injecting an impurity ion into active regions beside the gate structure in the semiconductor substrate by using the gate structure and the ion injection adjustment film as masks; and a fourth step of thermally diffusing the injected impurity ion by performing heat treatment on the active regions; wherein, in the second step, a film thickness of the ion injection adjustment film is chosen so as to prevent the impurity ion from being injected into the tunnel insulation film and to allow the impurity ion to reach a portion below a side end portion of the floating gate electrode in the active regions as a result of diffusive scattering of the impurity ion into the semiconductor substrate.

According to the method of fabricating a nonvolatile semiconductor memory device of the present invention, because the ion injection adjustment films are provided at least on the side surfaces of the floating gate electrode having a film thickness that can prevent injection of the impurity ion into the tunnel insulation film, the tunnel insulation film is not damaged by ion injection. Furthermore, because the ion injection adjustment film has a film thickness to allow the impurity ion to reach the portion below the floating gate electrode in the active regions as a result of scattering, a heat diffusion process of the impurity ion can be completed in a short period of time during the fourth step. As a result of this, it is possible to form semiconductor devices containing highly miniaturized CMOS circuits with high performance and nonvolatile semiconductor memory devices. Also, because the acceleration energy can be made relatively small when ions are injected, degradation of element isolation characteristic can be suppressed.

In the present method of fabricating a nonvolatile semiconductor memory device, the heat treatment of the fourth step is preferably performed in an oxidizing ambient.

In this case, it is preferred that the ion injection adjustment film is composed of a material having oxygen permeability, and the fourth step includes a step of oxidizing an upper portion of the active region, and of oxidizing a part of the floating gate electrode by using oxygen passing through the ion injection adjustment film.

Also, in this case, it is preferred that the fourth step of performing the heat treatment is carried out at a temperature of about 850 degrees C. or higher.

In the method of fabricating a nonvolatile semiconductor memory device of the present invention, the film thickness of an ion injection adjustment film is preferably about 50 nm or lower.

In the method of fabricating a nonvolatile semiconductor memory device of the present invention, it is preferred that the second step includes a step of depositing the ion injection adjustment film on the entire surface of the semiconductor substrate including the gate structure, and a step of exposing the active region by performing anisotropic etching on the deposited ion injection adjustment film.

In the method of fabricating a nonvolatile semiconductor memory device of the present invention, it is preferred that the second step includes a step of forming the ion injection adjustment film on the entire surface of the semiconductor substrate including the gate structure by using a thermal oxidation method, and a step of exposing an upper surface of the active region by performing anisotropic etching on the formed ion injection adjustment film.

In the method of fabricating a nonvolatile semiconductor memory device of the present invention, it is preferred that the third step includes a first ion injection step performed on the active region beside one side surface of the gate structure and a second ion injection step performed on the active region beside the other side surface of the gate structure.

In this case, it is preferred that the first ion injection step or the second injection step includes a step of injecting at least two types of impurity ions having an opposing conductivity type to that of the semiconductor substrate.

Also, in this case, it is preferred that the first ion injection step or the second injection step includes a step for injecting impurity ions having a same conductivity type as the conductivity type of the semiconductor substrate and impurity ions having a conductivity type opposite to the conductivity type of the semiconductor substrate.

In the method of fabricating a nonvolatile semiconductor memory device of the present invention, it is preferred that the second step includes a step of masking the ion injection adjustment film on one side surface of the gate structure while exposing the ion injection adjustment film on the other side surface of the gate structure, and a step of performing anisotropic etching the ion injection adjustment film being exposed on said other side surface of the gate structure.

In this case, it is preferred that the second step includes a step of adjusting the film thickness of the ion injection adjustment film by performing etching after anisotropic etching.

In the method of fabricating a nonvolatile semiconductor memory device of the present invention, it is preferred that the first step includes a step of forming a protective insulation film on the control gate electrode.

In the method of fabricating nonvolatile semiconductor memory devices of the present invention, it is preferred that, after the fourth step, the method further includes a fifth step of forming insulative side wall spacers on the side surfaces of the gate structure with the ion injection adjustment films interposed therebetween, and a sixth step of injecting into the substrate an impurity ion having a conduction type opposite to a conduction type of the semiconductor substrate by using the gate structure, the ion injection adjustment films and the insulative side wall spacers as masks.

In the method of fabricating a nonvolatile semiconductor memory device of the present invention, it is preferred that the second step includes a step of forming the ion injection adjustment film by silicon nitride.

In the method of fabricating a nonvolatile semiconductor memory device of the present invention, it is preferred that the second step of forming the ion injection adjustment film comprises a step of forming a first adjustment film comprising silicon oxide, and a step of forming a second adjustment film comprising silicon nitride on the first adjustment film.

In this case, it is preferred that the second step includes a step of removing a lower end portion of the second adjustment film after forming the second adjustment film.

DETAILED DESCRIPTION OF THE INVENTION

Figure 1A:
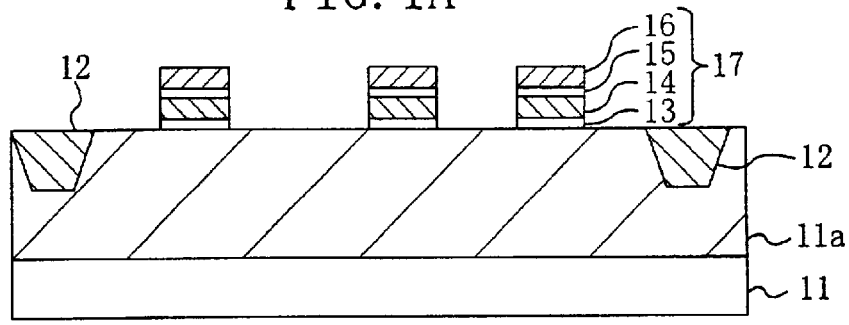
FIGS. 1A to 1C are structural cross sectional views which show a process sequence for a method of fabricating a nonvolatile semiconductor memory device in Embodiment 1 of the present invention.

The inventors of the present invention have found the following as a result of examining various methods to allow heat treatment time for impurity diffusion to be reduced while preventing the tunnel insulation film to be damaged as a result of injections of impurity ions into a semiconductor substrate, when forming a source diffusion layer and a drain diffusion layer by ion injections and heat treatment thereafter in a nonvolatile semiconductor memory device.

That is, after depositing a tunnel insulation film, a floating gate electrode, a capacitive insulation film and a control gate electrode are deposited on a semiconductor substrate in this order, a gate structure composed of the tunnel insulation film, the floating gate electrode, the capacitive insulation film and the control gate electrode, is formed. Then, by providing ion injection adjustments film with a film thickness that is smaller than the thickness of a conventional insulative side wall spacer on the side surfaces of the gate structure, heat treatment time for impurity diffusion can be reduced.

The film thickness of the ion injection adjustment film on the side surface of the gate structure is set to no less than 7.5 nm and no more than 50 nm. With this condition, impurity ions are injected into the semiconductor substrate by using a low acceleration energy such that the tunnel insulation film is not damaged even when the film thickness of the ion injection adjustment film is relatively small as this. Then, by performing heat treatment, especially, a thermal oxidation process in an oxidizing ambient, even if the tunnel insulation film is damaged, the damaged portions are restored and injected impurity ions are diffused to the channel region that is located below the gate structure.

Furthermore, it is preferred that impurity ions are injected parallel to the side surface of the gate structure in order that the ion injection adjustment film accomplishes masking effect of impurity ions against the tunnel insulation film. Therefore, it is preferred that the ion injection insulation film located on the side surface of the gate structure is perpendicular to the substrate surface. However, in reality, the side surface of the gate structure is generally not perpendicular to the substrate surface because of process variations, so that the ion injection insulation film located on the side surface of the gate structure is rarely perpendicular to the substrate surface.

Therefore, because impurity ions injected into the ion injection adjustment film are scattered within the ion injection adjustment film, they are also diffused in a direction parallel to the substrate surface, so that an ion injection adjustment film must have a film thickness which does not allow injected impurity ions to reach at least the floating gate electrode. Specifically, the film thickness of the ion injection adjustment film must be twice the standard deviation $\Delta Rp$ of static positions of impurity ions or more in relation to the insulation film which forms the ion injection adjustment film.

On the other hand, if an ion injection film is not provided on the active region forming a source diffusion layer and a drain diffusion layer, an acceleration energy of impurity ions can be relatively small as in conventional fabrication methods of nonvolatile semiconductor memory devices.

That is, in order to inject impurity ions into the interior of a semiconductor substrate, at least 5 keV or more of an acceleration energy is required even for phosphorous (P) ions, for example, which have the smallest mass among n-type conductive impurity ions so that a value of twice their standard deviation $\Delta Rp$ is 7.5 nm. Therefore, in order for an ion injection adjustment film to become a mask for a tunnel insulation film, the injection adjustment film is required to have at least 7.5 nm of film thickness.

Impurity ions injected into a semiconductor substrate are also diffused in a direction parallel to the substrate surface as a result of scattering out within the semiconductor substrate. For example, assume that an average travel distance Rp of injected impurity ions is 50 nm, then, in the case of phosphorous ions, the standard deviation $\Delta Rp$ is 16 nm when an acceleration energy is 40 keV. In the case of arsenic (As) ions, the standard deviation ΔRp is 10 nm when an acceleration energy is 80 keV. And, in the case of antimony (Sb) ions, the standard deviation ΔRp is 8 nm when an acceleration energy is 120 keV.

Therefore, a film thickness of the ion injection adjustment film may be set to no more than a sum of the distances of thermal diffusion and diffusion parallel to the substrate surface.

Furthermore, considering the objective of the present invention, which is to reduce thermal hysteresis, a film thickness of an ion injection adjustment film must be less than the diffusion distance of impurity ions injected in a direction parallel to the substrate surface.

For example, for a nonvolatile semiconductor memory device which uses silicon (Si) as a semiconductor substrate, concentration peaks of the impurity ion of the source diffusion layer and the drain diffusion layer are normally more than $1 \times 10^{20}$ cm$^{-3}$ and an impurity concentration of the semiconductor substrate is normally about $1 \times 10^{17}$ cm$^{-3}$. Based on this, a diffusion distance in the direction parallel to the substrate surface is defined as one thousandth (1/1000) of impurity ion concentration peak.

Since the ratio between impurity ion concentration peak and impurity concentration of semiconductor substrate is one thousandth, about 3 times the standard deviation Δ Rp is equivalent to a concentration of one thousandth. Based on this, taking the most easily diffused phosphorus ion as an example, the standard deviation ΔRp is 16 nm when an acceleration energy is 40 keV where an average travel distance Rp is 50 nm. Thus, the film thickness of ion injection adjustment film can be about 50 nm which is 3 times the standard deviation ΔRp.

Furthermore, even if an acceleration energy is reduced, injected impurity ions may damage a tunnel insulation film so that it is preferred to perform heat treatment. Since oxygen can easily be permeated through the ion injection adjustment film according to the present invention, any damaged portions of a tunnel insulation film can be restored. For example, if an ion injection adjustment film is formed by an oxide film using a low pressure CVD method, a permeation amount of oxygen is increased as the film thickness is reduced. At a temperature of 850 degrees C. or higher, such as dry oxidizing ambient of about 900 degrees C., oxygen is permeated through an oxide film with a thickness of 50 nm in a period of about one third of the time required where the film thickness is 100 nm.

Based on these findings, during a diffusion process of injected impurity ions, in order to restore damaged portions of a tunnel insulation film, diffusion of impurity ions in a direction parallel to a substrate surface can be assisted by enhanced diffusion by performing a thermal oxidation process in an oxidizing ambient. For example, in the case of phosphorous ions, even with heat treatment of 900 degrees C., phosphorous ions are diffused to a distance of 50 nm in about 15 minutes, therefore, this thermal oxidation enhanced diffusion diffuses impurity ions in shorter time than heat treatment that uses inert gas ambient, and thermal hysteresis can be reduced further.

As explained above, in the present invention, because a tunnel insulation film can be masked against impurity ions, which are injected into the source diffusion layer and the drain diffusion layer, by providing an ion injection adjustment film with a film thickness being from about 7.5 nm to about 50 nm at least on the side surface of a floating gate electrode, any damage to the tunnel insulation film can be suppressed. The injected impurity ions are diffused to near a channel region as a result of being scattered within the semiconductor substrate. Furthermore, in order to recover damaged portions of a tunnel insulation film, by using a thermal oxidation method, which completes in shorter time, thermal hysteresis of each component material of a semiconductor device can be reduced further. Because impurity ion injection can be performed with a low acceleration energy, degradation in the performance of element isolation function can be suppressed.

Embodiment 1

Embodiment 1 of the present invention is explained below by referring to figures.

FIG. 1A to FIG. 1C, FIG. 2A and FIG. 2B are cross sectional views which show a process sequence for a method of fabricating a nonvolatile semiconductor memory device in Embodiment 1 of the present invention.

First, as shown in FIG. 1A, for example, a p-type well 11a is formed on a semiconductor substrate 11 of p-type silicon and, then, an element isolation insulation film 12 (hereinafter referred to as insulation film) such as trench isolation film is selectively formed. Then, a tunnel insulation film 13 composed of silicon oxide, a poly-silicon floating gate electrode 14, a capacitor insulator film 15 composed of silicon oxide or silicon nitride, and a poly-silicon control gate electrode 16 with about 300 nm film thickness for example, are sequentially deposited on the element forming region on the semiconductor substrate 11, thereby forming selectively a plurality of stacked-type gate structures 17, each of which is composed of the tunnel insulation film 13, the floating gate electrode 14, the capacitor insulator film 15, and the control gate electrode 16.

Figure 1B:
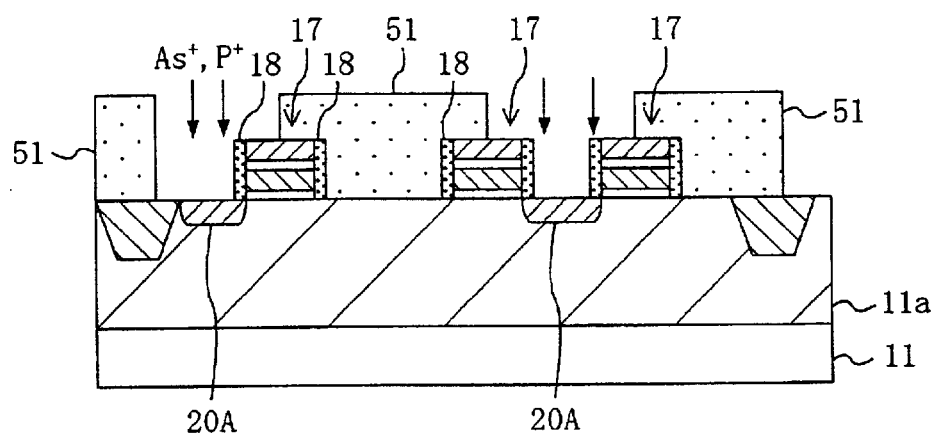

Next, as shown in FIG. 1B, by using a low pressure CVD method for example, a silicon oxide film that covers the entire semiconductor substrate 11 including the respective gate structures 17 and has a film thickness of about 10 nm to 50 nm is deposited. Then, by performing anisotropic dry etching on the silicon oxide film, ion injection adjustment films 18 composed of silicon oxide are formed on the side surfaces of each gate structure 17 in the gate length direction.

Subsequently, a first resist pattern 51 is formed so as to expose the source forming region, which is an active region located beside each gate structure 17 in the p-type well 11a, and the ion injection adjustment film 18 located on the side surface of the source forming region side of each gate structure 17. Then, by using the first resist pattern 51 and the exposed portions of the gate structure 17 as well as the ion injection adjustment film 18 as masks, a first n-type injection layer 20A is formed by injecting n-type impurity ions into the p-type well 11A. Here, arsenic (As) ions and phosphorous (P) ions are injected separately under an injection condition where an acceleration energy is about 10 keV and dosage is about $1 \times 10^{15}$ cm$^{-2}$. As publicly known, arsenic (As) ions reduce contact resistance of the source electrode and phosphorous ions increase bonding pressure resistance.

Figure 1C:
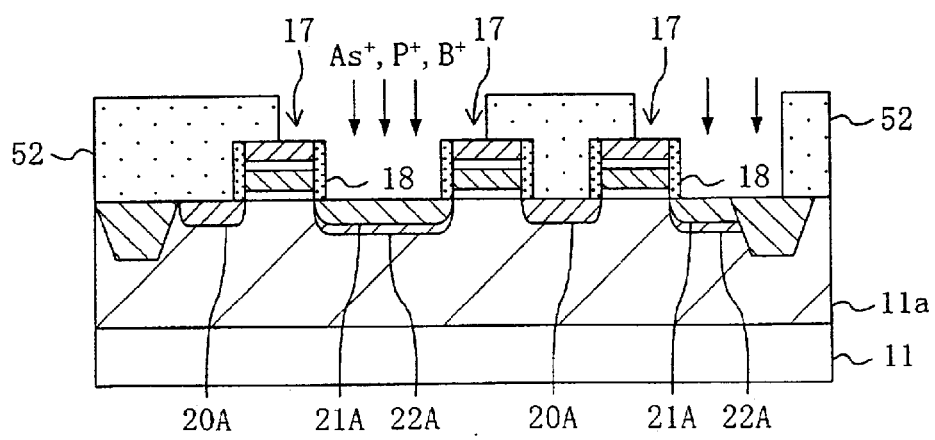

Next, as shown in FIG. 1C, after the first resist pattern 51 is removed, a second resist pattern 52 is formed so as to expose the drain forming region, which is the active region in the p-type well 11a, and the ion injection adjustment film 18 located on the side surface of the drain forming region side of each gate structure 17. Then, by using the second resist pattern 52 and the exposed portions of the gate structure 17 as well as the ion injection adjustment film 18 as masks, n-type impurity ions and p-type impurity ions are injected sequentially into the p-type well 11a.

Specifically, the second n-type injection layer 21A is formed by performing a first injection step, which uses arsenic ions as n-type impurity ions with an acceleration energy of about 10 keV and dosage of about $2\times10^{14}$ cm$^{-2}$ for example, and a second injection step, which uses phosphorous ions with an acceleration energy of about 10 keV and dosage of about $1\times10^{14}$ cm$^{-2}$. Then, for example, a p-type injection layer 22A is formed by performing a third injection step, which uses boron (B) ions as p-type impurity ions with an acceleration energy of about 10 keV and dosage of about $4\times10^{13}$ cm$^{-2}$. Here, each injection step from the first to the third can be performed in a suitable sequence.

Also, although ion injection into a source forming region is performed before ion injection into a drain forming region, ion injection into a drain forming region may be performed first.

Figure 2A:
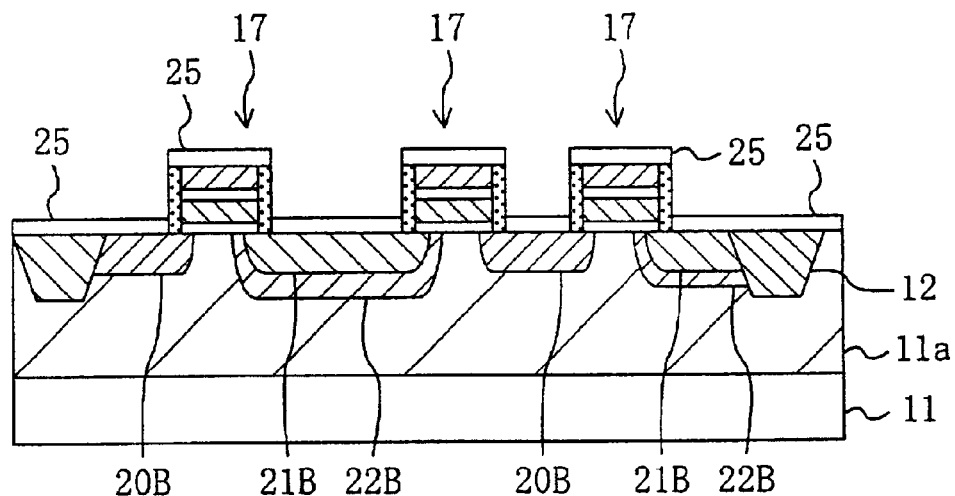
FIGS. 2A and 2B are cross sectional views which show a process sequence for the method of fabricating a nonvolatile semiconductor memory device in Embodiment 1 of the present invention.

Next, as shown in FIG. 2A, after removing the second resist pattern 52, enhanced diffusion is performed on the semiconductor substrate 11 having the first n-type injection layer 20A, the second n-type injection layer 21A and the p-type injection layer 22A for the respective impurity ions, which are included in the first n-type injection layer 20A, the second n-type injection layer 21A and the p-type injection layer 22A, respectively, by carrying out thermal oxidation, for example, about 5 minutes in a dry oxidation ambient at a temperature of about 900 degrees C. Because of this enhanced diffusion, each end of the first n-type injection layer 20A and the second n-type injection layer 21A reliably reaches the channel region located below the each gate structure 17 in the p-type well 11a. As a result of this, a source diffusion layer 20B is formed from the first n-type injection layer 20A and a drain diffusion layer 21B is formed from the second n-type injection layer 21A. Because the impurity concentration of a p-type diffusion layer 22B that is formed from the p-type injection layer 22A is larger than the impurity concentration of the p-type well 11a, junction voltage is increased at the channel region portion of PN junction plane between the p-type diffusion layer 22B and the drain diffusion layer 21B and, therefore, generation efficiency of hot electrons is improved.

As a result of dry thermal oxidation at this time, a thermal oxidation film 25 is formed on the upper portion of the active region of the semiconductor substrate 11 and the upper portion of each gate structure 17.

Figure 2B:
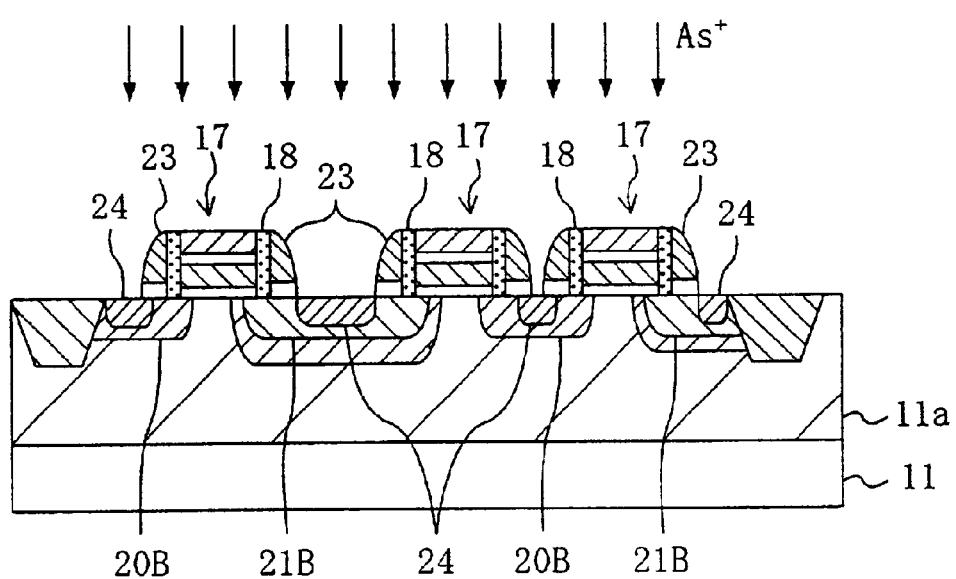

Next, as shown in FIG. 2B, by using a CVD method for example, a silicon oxide film, which covers the entire semiconductor substrate 11 including each gate structure 17 and has a film thickness of about 100 nm to 200 nm, is deposited and by performing anisotropic dry etching on the deposited silicon oxide film, insulative side wall spacers 23 composed of silicon oxide are formed on the side surfaces of each gate structure 17 with each ion injection adjustment film 18 interposed therebetween. Next, arsenic ions are injected into source diffusion layer 20B and drain diffusion layer 21B by using the formed insulative side wall spacer 23, the ion injection adjustment film 18 and the gate structure 17 as masks with an injection condition where an acceleration energy is about 40 keV and dosage is about $5\times10^{15}$ cm$^{-2}$. Then, N$^+$ diffusion layer 24 is formed on the exposed portions of the source diffusion layer 20B and drain diffusion layer 21B by performing sufficient heat treatment to activate injected arsenic ions. After this, although not shown in any figure, an interlayer insulation film is formed on the semiconductor substrate 11, and contacts electrically connected to the source diffusion layer 20B or drain diffusion layer 21B are formed on the formed interlayer insulation film. Additionally, metal wiring composed of aluminum, etc. to connect with contacts, is formed on the interlayer insulation film.

As explained above, with Embodiment 1, while each side surface of the floating gate electrode 14 and the control gate electrode 16 is covered with the ion injection adjustment film 18 with a film thickness of about 10 nm to 50 nm, the active region of the semiconductor substrate 11 is exposed. Because of this, even with a relatively small acceleration energy of about 10 keV, injected arsenic ions and phosphorous ions reach predetermined locations of the semiconductor substrate 11 but almost never pass through the ion injection adjustment film 18. Thus, damages to the tunnel insulation film 13 can be prevented substantially in the same way as conventional methods.

In this way, because the ion injection adjustment film 18 related to Embodiment 1 has a small film thickness of about 10 nm to 50 nm unlike the conventional insulative side wall spacer, arsenic ions or phosphorous ions, which are injected into the semiconductor substrate 11, can reach a channel region located below the gate structure 17 in the p-type well 11a as a result of being scattered and diffused in the direction parallel to substrate surface.

Also, since the ion injection adjustment film 18 has a film thickness which allows impurity ions to reach lower portion of the gate structure 17 of the active region as a result of impurity ions being diffused into the semiconductor substrate 11 caused by scattering, an acceleration energy during ion injection can be made relatively small. Thus, degradation of element isolation characteristic can be suppressed as well.

Furthermore, since the ion injection adjustment film 18 has a film thickness, which allows oxygen to fully pass through even with thermal oxidation process of about 5 minutes in a dry oxidizing ambient at a temperature of about 900 degrees C., although any damages are generated on the tunnel insulation film 13 by a plurality of ion injection processes, these damages can be restored. In addition, as a result of heat treatment carried out in an oxidizing ambient, speed of enhanced diffusion of arsenic ions or phosphorous ions in the semiconductor substrate 11 is further increased by oxygen. In addition to this, the film thickness of the ion injection adjustment film 18 is small, thereby, arsenic ions or phosphorous ions can reach the channel region located below the gate structure 17 in shorter time.

In this way, since processing time of thermal diffusion can be made shorter than conventional time, forming of microprocessors including CMOS circuits and others is easily accomplished.

Embodiment 1, unlike the conventional examples, is the flash memory into which data is written by using channel hot electron, and so-called asymmetrical injection, where injection ion type and dosage are different for the source diffusion layer 20B and the drain diffusion layer 21B.

With conventional examples, if asymmetrical injection is used, although drain diffusion layer which is formed by injecting arsenic ions with small dose which is not easily diffused, requires heat treatment with high temperature and a long period of time, source diffusion layer, which is formed by injecting easily diffused phosphorous ions with large dose, allows diffusion to take place with little heat treatment. As a result of this, short channel effect is increased and it is difficult to form source diffusion layer with one application of heat treatment.

On the other hand, with Embodiment 1, since the film thickness of the ion injection adjustment film 18 is small and diffusion amount of the drain diffusion layer 21B is small, although asymmetrical injection is applied to the source diffusion layer 20B and the drain diffusion layer 21B, controllability of impurity concentration and junction plane for the source diffusion layer 20B and the drain diffusion layer 21B is good.

Furthermore, with Embodiment 1, the source diffusion layer 20B and the drain diffusion layer 21B are formed by using the ion injection adjustment film 18 having a relatively small film thickness as a mask and, then, arsenic ions with an acceleration energy of about 40 kev and dose of about $5 \times 10^{15}$ cm$^{-2}$ are injected by using the insulative side wall spacer 23 with a film thickness of about 100 nm to 200 nm as a mask. Next, an N$^+$ diffusion layer 24 is formed by performing relatively mild heat treatment to activate the injected arsenic ions. Because of this, resistance values of the source diffusion layer 20B and the drain diffusion layer 21B are lowered.

With Embodiment 1, although it is assumed that a nonvolatile semiconductor memory device is a type where data is written by channel hot electrons, a nonvolatile semiconductor memory device may be a type where data is written by Fowler-Nordheim (FN) current. In this case, ion injection for forming the source diffusion layer 20B and the drain diffusion layer 21B is performed with ion types and dose, which are different from those of the present embodiment.

Also, the source diffusion layer 20B and drain diffusion layer 21B do not necessarily require asymmetrical injection but may be applied with a so-called symmetrical and self aligning injection, where neither the first resist pattern 51 nor the second resist pattern 52 is used but each gate structure 17 and each ion injection adjustment film 18 are used as masks.

Silicon oxide is used for the ion injection film 18 but silicon nitride may be used instead of silicon oxide.

A Variation of Embodiment 1

Variation of Embodiment 1 of the present invention is explained in the following by referring to figures.

Figure 3A:
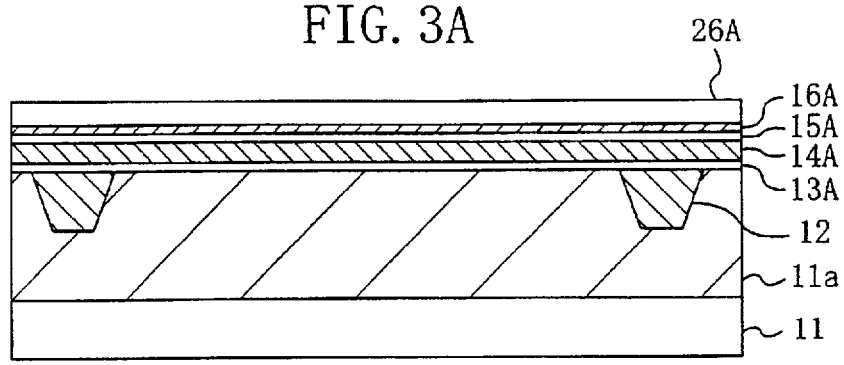
FIGS. 3A to 3C are structural cross sectional views which show a process sequence for the method of fabricating a nonvolatile semiconductor memory device in a variation example of Embodiment 1 of the present invention.
Figure 3B:
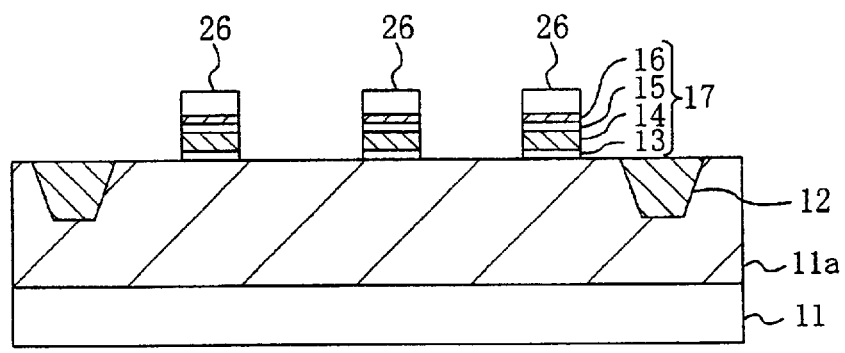
Figure 3C:
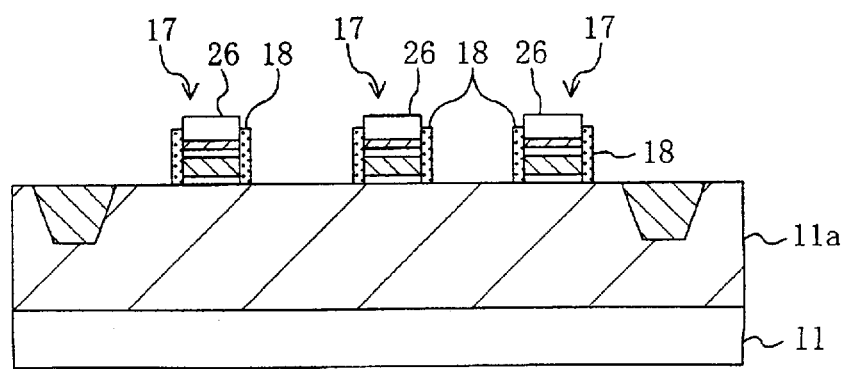

FIG. 3A to FIG. 3C are cross sectional views which show a process sequence for a method of fabricating a nonvolatile semiconductor memory device in a variation of Embodiment 1 of the present invention. In FIG. 3A to FIG. 3C, components that are the same as the components of FIG. 1A to FIG. 1C are denoted by the same reference numbers and symbols.

First, as shown in FIG. 3A, a p-type well 11A and an insulation film 12, in this order, are formed above a semiconductor substrate 11. Then, a film 13A for forming a tunnel insulation film composed of silicon oxide, a film 14A for forming a floating gate electrode of poly-silicon, a film 15A for forming a capacitor insulator film composed of silicon oxide or silicon nitride, and a film 16A for forming a control gate electrode of poly-silicon having about 70 nm film thickness are sequentially deposited on the entire area of the semiconductor substrate 11. Then, for example, by using CVD method, a protective insulation film 26A that is composed of silicon oxide or silicon nitride with a film thickness of about 150 nm is deposited on the film 16A for forming a control gate electrode.

Next, as shown in FIG. 3B, a hard mask 26 having a gate structure pattern is formed from the protective insulation film 26A by selectively etching the protective insulation film 26A. Then, a plurality of stacked-type gate structures 17 each of which is composed of a tunnel insulation film 13, a floating gate electrode 14, a capacitor insulator film 15, and a control gate electrode 16 are formed by anisotropic dry etching using the formed hard mask 26. The control gate electrode 16 is formed from the film 16A, the capacitor insulator film 15 is formed from the film 15A, the floating gate electrode 14 is formed from the film 14A and the tunnel insulation film 13 is formed from the film 13A.

Then, as shown in FIG. 3C, by using a CVD method, a silicon oxide film with a film thickness of about 10 nm to 50 nm is deposited on the entire surface of the semiconductor substrate 11 including each gate structure 17. Then, ion injection adjustment films 18 composed of silicon oxide are formed on the side surfaces of each gate structure 17 in the gate length direction side by performing anisotropic etching on the silicon oxide film.

Following this, in the same way as Embodiment 1, a source diffusion layer and a drain diffusion layer are formed by performing asymmetrical injection of impurity ions into source forming regions and drain forming regions and, then, by performing thermal oxidation process in a dry oxidizing ambient.

In this manner, with this variation, even in a case where the film thickness of the control gate electrode 16 is smaller than that of the control gate electrode in Embodiment 1, the ion injection film 18 can fully cover the end surface of the capacitive insulation film 15 because the protective insulation film 26 is provided on the control gate electrode 16. Therefore, although anisotropic etching resulted in over-etching when the ion injection adjustment 18 is formed, any damages of the capacitive insulation film 15 caused by ion injections can be prevented.

Embodiment 2

Embodiment 2 of the present invention is explained in the following by referring to figures.

FIG. 4A to FIG. 4C and FIG. 5 are cross sectional views which show a process sequence for a method of fabricating a nonvolatile semiconductor memory device in Embodiment 2 of the present invention. Here as well, in FIG. 4A to FIG. 4C and FIG. 5, components which are the same as the components of FIG. 1A to FIG. 1C, FIG. 2A and FIG. 2B are denoted by the same reference numerals and symbols.

Figure 4A:
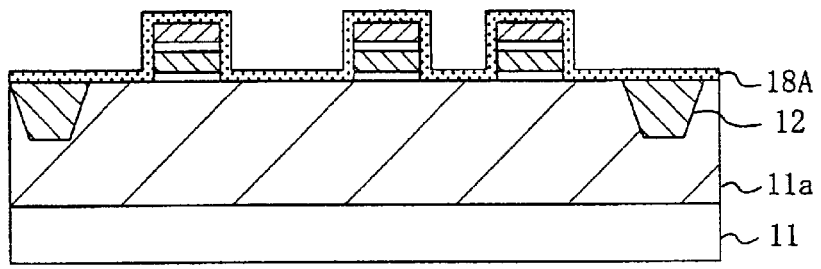
FIGS. 4A to 4C are structural cross sectional views which show a process sequence for a method of fabricating a nonvolatile semiconductor memory device in Embodiment 2 of the present invention.

First, as shown in FIG. 4A, a p-type well 11a is formed on a semiconductor substrate 11, which is composed of p-type silicon, and, then, an insulation film 12 such as trench isolation and others is formed. Then, a tunnel insulation film 13 composed of silicon oxide, a floating gate electrode 14 of poly-silicon, a capacitor insulator film 15 composed of silicon oxide or silicon nitride, and a control gate electrode 16 of poly-silicon having about 300 nm film thickness are sequentially deposited on element forming regions of the semiconductor substrate 11. As a result, a plurality of stacked-type gate structures 17 each of which is composed of the tunnel insulation film 13, the floating gate electrode 14, the capacitor insulator film 15 and the control gate electrode 16 are selectively formed. Then, for example, by using a low pressure CVD method, a film 18A for forming an ion injection adjustment film which is composed of silicon oxide with a film thickness of about 10 nm to 50 nm is deposited on the entire surface of the semiconductor substrate 11 including the gate structures 17.

Figure 4B:
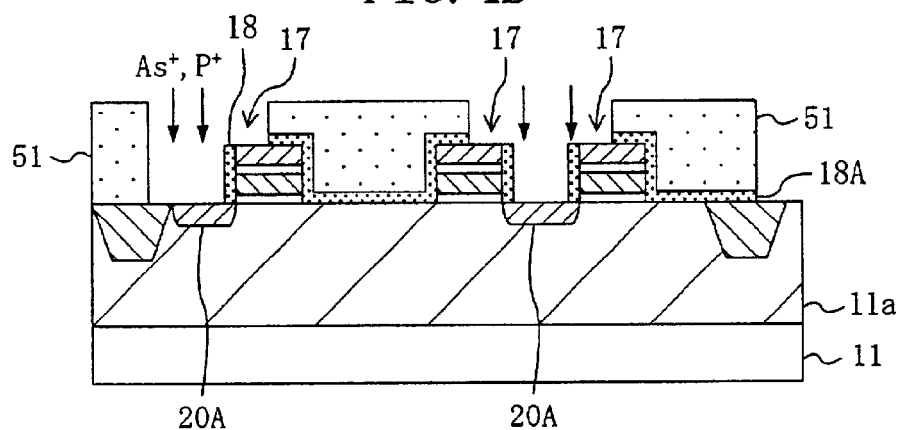

Next, as shown in FIG. 4B, a first resist pattern 51 is formed to expose the portion of the film 18A corresponding to the source forming region and the portion of each gate structure 17 on the side of the source forming region. Then, an ion injection adjustment film 18 is formed on one side surface of the gate structure 17 by performing anisotropic dry etching on the film 18A by using the formed first resist pattern 51 as a mask. After this, a first n-type injection layer 20A is formed by injecting n-type impurity ions into the p-type well 11a by using the first resist pattern 51, and the exposed portions of the gate structure 17 and the ion injection adjustment film 18 as masks. Here, arsenic ions and phosphorous ions are separately injected with an injection condition where an acceleration energy is about 10 keV and dose is about $1\times10^{15}$ cm$^{-2}$. Later, after the first resist pattern 51 is removed, the film thickness of the ion injection adjustment film forming film 18A is reduced by about 2 nm for optimization by, for example, performing wet etching by hydrofluoric acid on the ion injection adjustment film forming film 18A.

Figure 4C:
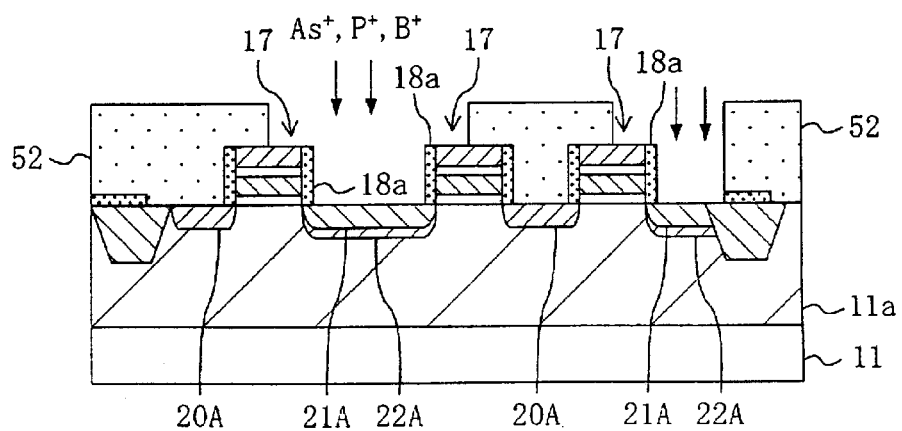

Next, as shown in FIG. 4C, a second resist pattern 52 is formed to expose the portion of the film 18A with an optimal film thickness corresponding to the drain forming region and the portion of each gate structure 17 on the side of the drain forming region. Then, by using the second resist pattern 52 as a mask, an ion injection adjustment film 18a made into thin film is formed on the other side surface of the gate structure 17 by performing anisotropic dry etching on the film 18A. Then, n-type impurity ions and p-type impurity ions are injected sequentially by using the second resist pattern 52 and the exposed portions of the gate structure 17 and the thin ion injection adjustment film 18a as masks.

That is, the second n-type injection layer 21A is formed, for example, by a first injection step, which uses arsenic ions with an acceleration energy of about 10 keV and dose of about $2\times10^{14}$ cm$^{-2}$, and a second injection step, which uses phosphorous ions with an acceleration energy of about 10 keV and dose of about $1\times10^{14}$ cm$^{-2}$. Then, a p-type injection layer 22A is formed by a third injection step, which uses, for example, boron ions with an acceleration energy of about 10 keV and dose of about $4\times10^{13}$ cm$^{-2}$. Furthermore, here as well, each injection step from the first to the third can be performed in any sequence. The step of injecting ions into the source forming regions and the step of injecting ions into the drain forming regions can be performed in any order.

Although wet etching, which is used to obtain the thin ion injection adjustment film 18a that is a part of the mask when injecting ions into drain forming regions, is not necessarily required, the wet etching is effective to change the film thickness of the ion injection adjustment film 18, which is a part of the mask when injecting ions into the source forming regions. Also, if ion injection into the drain forming regions is performed first, the film thickness of the ion injection adjustment film 18 on the side of the source forming region can be made smaller than the film thickness of the thin film ion injection adjustment film 18a on the side of drain forming regions.

Figure 5:
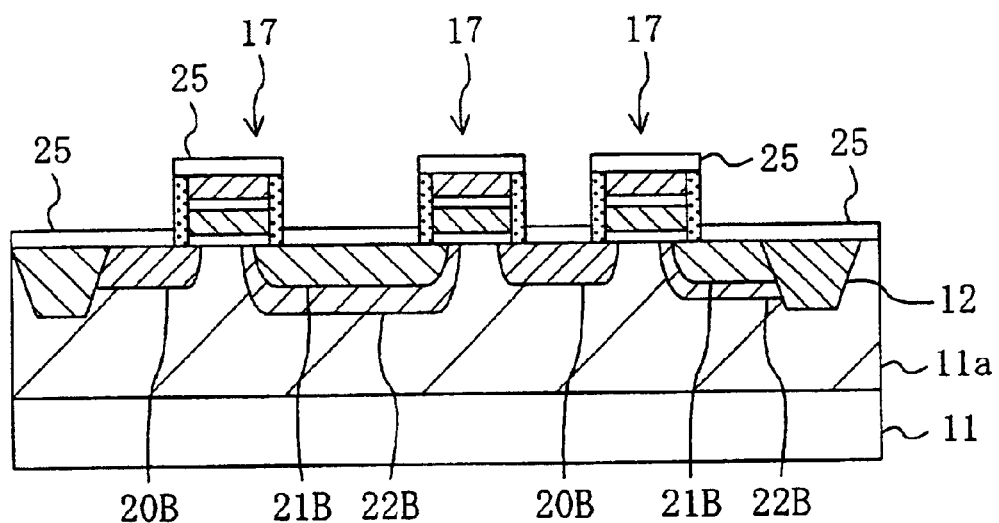
FIG. 5 is a structural cross sectional view which shows a process sequence for the method of fabricating a nonvolatile semiconductor memory device in Embodiment 2 of the present invention.

Next, as shown FIG. 5, after the second resist pattern 52 is removed, by performing thermal oxidation of about 5 minutes at a temperature of about 900 degrees C. in a dry oxidizing ambient, for example, on the semiconductor substrate 11 on which the first n-type injection layer 20A, the second n-type injection layer 21A and the p-type injection layer 22A are formed, enhanced diffusion takes place for the impurity ions which are contained in the first n-type injection layer 20A, the second n-type injection layer 21A and the p-type injection layer 22A, respectively. With this enhanced diffusion, each end portion of the first n-type injection layer 20A and the second n-type injection layer 21A reliably reaches the channel region, which is located below each gate structure 17 in the p-type well 11a. As a result of this, the source diffusion layer 20B is formed from the first n-type injection layer 20A and the drain diffusion layer 21B is formed by the second n-type injection layer 21A. Also, because impurity concentration of the p-type diffusion layer 22B formed from the p-type injection layer 22A is larger than impurity concentration of the p-type well 11a, junction voltage of the channel region portion of PN junction surface between the p-type diffusion layer 22B and the drain diffusion layer 21B is increased, thereby, generation effectiveness of hot electrons is improved. By dry thermal oxidation at this time, a thermal oxidation film 25 is formed on the active region in the semiconductor substrate 11 and on each gate structure 17.

Following this, in the same way as Embodiment 1, insulative side wall spacers composed of silicon oxide are formed on the side surfaces of each gate structure 17 with the ion injection adjustment films 18, 18a interposed therebetween and arsenic ions are injected into the source diffusion layer 20B and the drain diffusion layer 21B while using the formed insulative side wall spacer, ion injection adjustment films 18, 18a and gate structure 17 as masks. After this, N$^+$ diffusion layer is formed on exposed portions of the source diffusion layer 20B and the drain diffusion layer 21B by performing heat treatment to activate injected arsenic ions.

As explained above, with Embodiment 2, because regions such as insulation film 12 and the like are masked with resist films when anisotropic etching is performed on the ion injection adjustment film 18, the insulation film 12 is not exposed to etching material, thereby, although the number of process steps for masking processes is the same as that of Embodiment 1, element isolation characteristics are not degraded.

Furthermore, with Embodiment 2, although, as shown in FIG. 4B and FIG. 4C, anisotropic etching on the film 18A for forming an ion injection adjustment is performed on both the source forming region and the drain forming region, anisotropic etching can be performed either on the source forming region or on the drain forming region.

Although silicon oxide is used for an ion injection adjustment film 18, silicon nitride can be used instead of silicon oxide. (A Variation of Embodiment 2)

Variation of Embodiment 2 of the present invention is explained in the following by referring to figures.

Figure 6A:
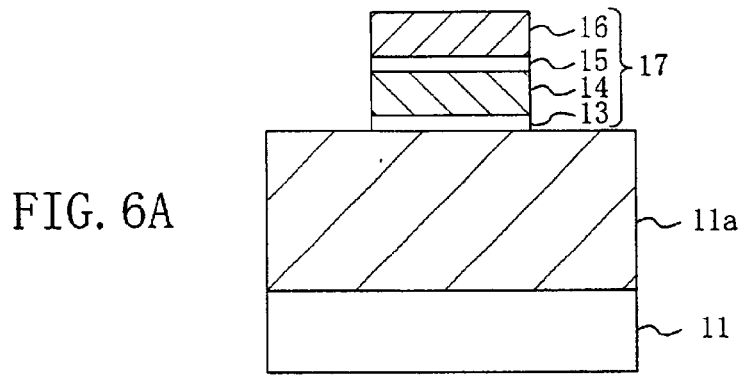
FIGS. 6A to 6C are structural cross sectional views which show a general process sequence for the method of fabricating a nonvolatile semiconductor memory device in a variation example of Embodiment 2 of the present invention.
Figure 6B:
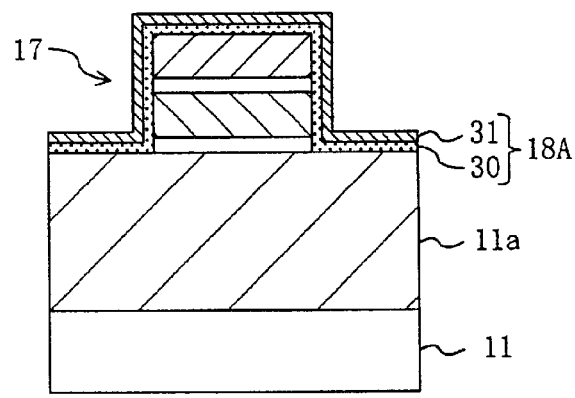
Figure 6C:
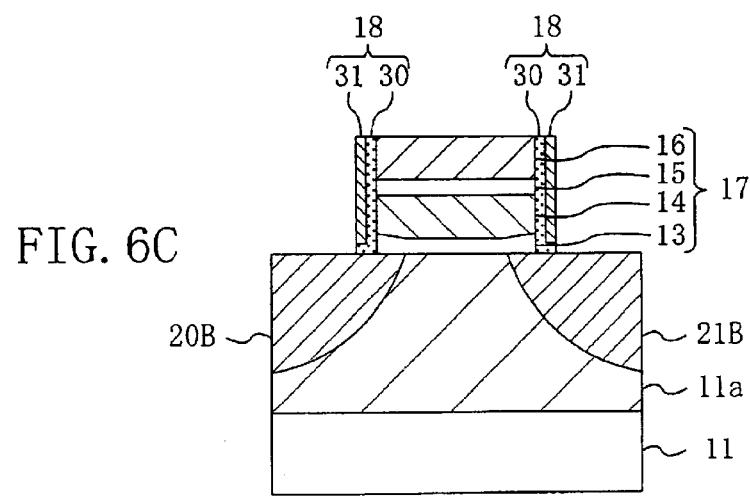
Figure 7A:
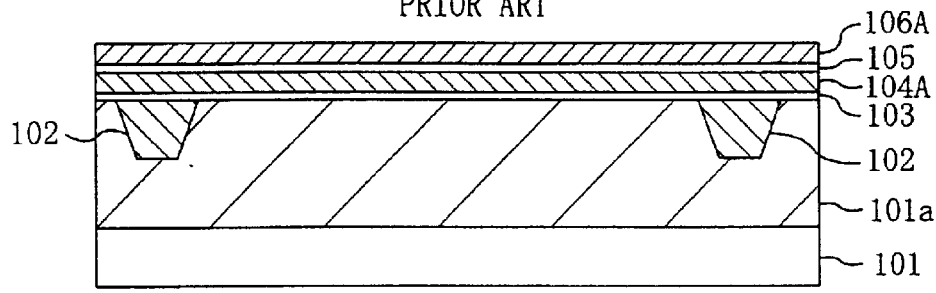
FIGS. 7A to 7C are structural cross sectional views which show a process sequence for a conventional method of fabricating a nonvolatile semiconductor memory device.
Figure 7B:
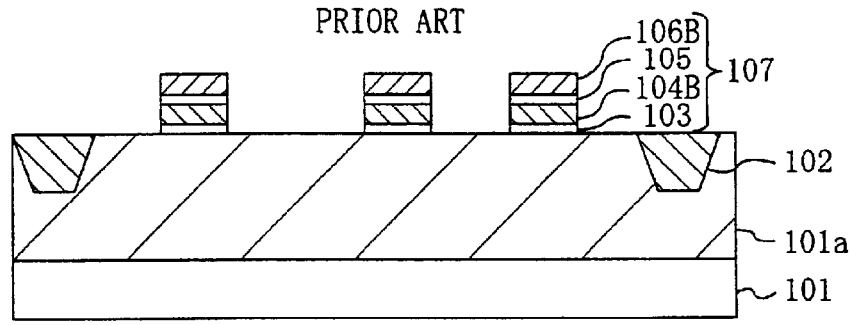
Figure 7C:
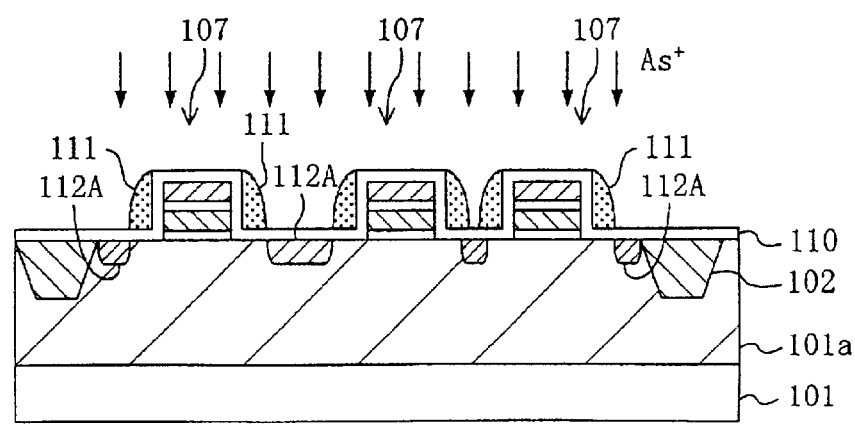
Figure 8:
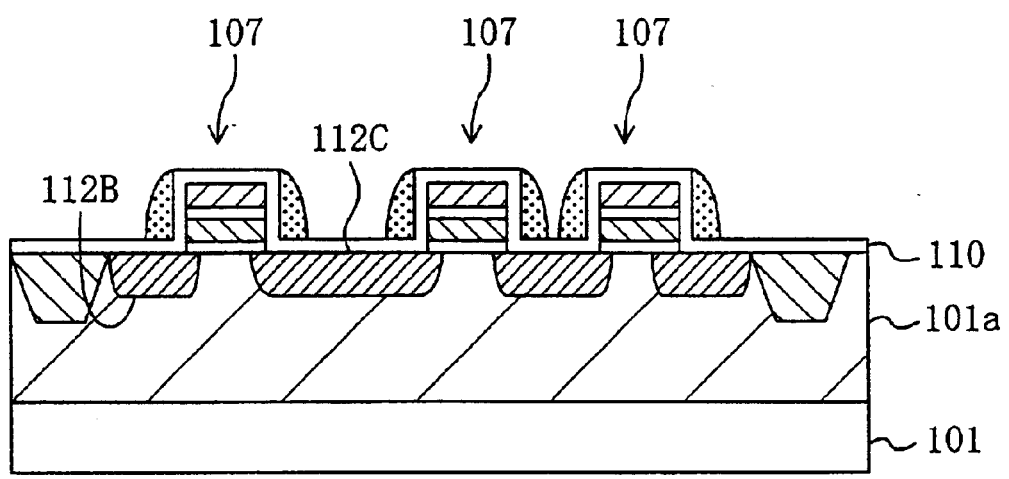
FIG. 8 is a structural cross sectional view which shows a process sequence for the conventional method of fabricating a nonvolatile semiconductor memory device.

FIG. 6A to FIG. 6C are cross sectional views which show a process sequence for the method of fabricating a nonvolatile semiconductor memory device in a variation of Embodiment 2 of the present invention. Here, one gate structure and ion injection adjustment film are used to explain general fabrication methods. Also, in FIG. 6A to FIG. 6C, components which are the same as the components of FIG. 4A to FIG. 4C are denoted by the same reference numerals and symbols.

A feature of this variation example is that the ion injection adjustment film is made by a multi-layer structure of silicon oxide and silicon nitride that are formed sequentially from the gate structure side.

First, as shown in FIG. 6A, a p-type well 11a is formed on a semiconductor substrate 11 composed of p-type silicon, and, then, a gate structure 17 composed of a tunnel insulation film 13, a floating gate electrode 14, a capacitive insulation film 15 and a control gate 16 is selectively formed on the p-type well 11a.

Next, as shown in FIG. 6B, using a low pressure CVD method, a film 18A for forming an ion adjustment film composed of a first adjustment film 30 and a second adjustment film 31 is formed by sequentially depositing the first adjustment film 30 composed of silicon oxide with a film thickness of about 5 nm, and the second adjustment film 31 composed of silicon nitride with a film thickness of about 15 nm, on the entire surface of the semiconductor substrate 11, which includes the upper surface and side surfaces of the gate structure 17.

Next, as shown in FIG. 6C, by performing anisotropic dry etching on the film 18A, ion injection adjustment films 18 are formed on the side surfaces of the gate structure 17 from the film 18A. At this time, in the same way as Embodiment 2, the ion injection adjustment films 18 can be formed by performing etching on the side of the source forming region and on the side of the drain forming region separately. Then, n-type impurity ions are injected into the p-type well 11a, and then, a source diffusion layer 20B and a drain diffusion layer 21B are formed by performing enhanced diffusion using a thermal oxidation process with a temperature of about 850 degrees C. for about 20 minutes. Here, explanation of the thermal oxidation film formed on the semiconductor substrate 11 and the gate structure 17 is omitted.

In this way, according to this variation example, because the ion injection adjustment film 18 is constructed on the side surface of the gate structure 17 by the first adjustment film 30 composed of silicon oxide, and the second adjustment film 31 composed of silicon nitride, various benefits as shown below are realized.

(1) Because film quality of silicon nitride is dense compared to silicon oxide, permeability of injected ions is reduced. For this reason, because the film thickness of the ion injection adjustment film 18 can be reduced, injection ions can easily reach the portion below the side end portion of the floating gate electrode 14, thereby heat treatment time to activate injection ions can be reduced.

(2) As shown in FIG. 6C, lower end portion of the first ion adjustment film 31 has a profile of a letter L by making the ion injection adjustment film 18 with a two layer structure. As a result of this, the first adjustment film 30 composed of silicon oxide is exposed from the bottom portion of the second adjustment film 31 composed of silicon nitride. Therefore, because oxygen can reach the tunnel insulation film 13 from the exposed portion of the first adjustment film 30 during a thermal oxidation process, the film thickness of side end portion of the tunnel insulation film 13 tends to be enlarged. On the other hand, because side end portion of the capacitive insulation film 15 is covered with the ion injection adjustment film 18, which includes silicon nitride, side end portion of the capacitive insulation film 15 can not be enlarged. Therefore, reduction of the capacitance binding ratio of the gate structure 17 can be suppressed. Here, the capacitance binding ratio means a ratio of the capacitance between the floating gate electrode 14 and the control gate electrode 16 against the total capacitance. Total capacitance is a summation of capacitance between the floating gate electrode 14 and the control gate 16 and capacitance between the floating gate electrode 14 and the semiconductor substrate 11 (p-type well 11a, source diffusion layer 20B and drain diffusion layer 21B).

(3) Because the second adjustment film 31, which is composed of silicon nitride that has larger stress than silicon oxide during film formation, is implemented not directly on the side wall of the gate structure 17 but with the first adjustment film 30 composed of silicon oxide interposed therebetween, the second adjustment film 31 gives less stress to the gate structure 17. Furthermore, because the first adjustment film gets into between lower end portion of the second adjustment film 31 and the semiconductor substrate 11, stress of the second adjustment film 31 against the gate structure 17 is reduced further.

Although a low pressure CVD method with silicon oxide is used for the first adjustment film 30, a thermal oxidation method can be used.

Also, the ion injection adjustment film 18, which is constituted by the first adjustment film 30 composed of silicon oxide and the second adjustment film 31 composed of silicon nitride, can be applied to Embodiment 1 and a variation example of Embodiment 1 as well.

Although a stacked-type gate is used for the gate structure 17 in Embodiment 1, Embodiment 2 and a variation example of Embodiment 2 explained above, so called a split-type gate structure, where the control gate electrode 16 and the floating gate electrode 14 are placed in parallel on the semiconductor substrate 11 with the tunnel insulation film 13 intervened therebetween and the capacitive insulation film 15 is interposed between the adjacent side faces of the floating gate electrode 14 and the control gate electrode 16, can be used instead.

Although a low pressure CVD method with silicon oxide is used for the ion injection adjustment film 18 above, a thermal oxidation method can be used. However, because film quality of silicon oxide is dense, permeability of oxygen is somewhat reduced with a thermal oxidation method.

What is claimed is:

1. A method for fabricating a nonvolatile semiconductor memory device, comprising:

a first step of forming a gate structure on a semiconductor substrate, the gate structure comprising a tunnel insulation film being in contact with the semiconductor substrate, a floating gate electrode being in contact with the tunnel insulation film, a control gate electrode facing the floating gate with an intervening capacitive insulation film;

a second step of forming ion injection adjustment films comprising an insulation film being in contact with the floating gate electrode at least on side surfaces of the floating gate electrode;

a third step of injecting impurity ions into an active region beside the gate structure in the semiconductor substrate by using the gate structure and each ion injection adjustment film as masks, such that the impurity ions do not reach the lower portion of the floating gate electrode in the active region; and a fourth step of thermally diffusing the injected impurity ions by performing heat treatment on the active region, such that the impurity ions reach the lower portion of the floating gate electrode in the active region;

wherein, in the second step, the film thickness of each ion injection adjustment film is chosen so as to prevent the impurity ions from being injected into the tunnel insulation film and to allow the impurity ions to reach a portion below a side end portion of the floating gate electrode in the active region as a result of diffusive scattering and the thermal diffusion of the impurity ions into the semiconductor substrate.

2. The method for fabricating a nonvolatile semiconductor memory device according to claim 1, wherein the heat treatment of the fourth step is performed in an oxidizing ambient.

3. The method for fabricating a nonvolatile semiconductor memory device according to claim 2, wherein each ion injection adjustment film is composed of a material having oxygen permeability, and the fourth step includes a step of oxidizing an upper portion of the active region, and of oxidizing a part of the floating gate electrode by using oxygen transmitted through each ion injection adjustment film.

4. The method for fabricating a nonvolatile semiconductor memory device according to claim 2, wherein the fourth step of performing the heat treatment is carried out at a temperature of about 850 degrees C. or higher.

5. The method for fabricating a nonvolatile semiconductor memory device according to claim 1, wherein the film thickness of each ion injection adjustment film is about 50 nm or lower.

6. The method for fabricating a nonvolatile semiconductor memory device according to claim 1, wherein the second step includes a step of depositing each ion injection adjustment film on the entire surface of the semiconductor substrate including the gate structure and a step of exposing the active region by performing anisotropic etching on each deposited ion injection adjustment film.

7. The method for fabricating a nonvolatile semiconductor memory device according to claim 1, wherein the second step includes a step of forming each ion injection adjustment film on the entire surface of the semiconductor substrate including the gate structure by using a thermal oxidation method, and a step of exposing an upper surface of the active region by performing anisotropic etching on each formed ion injection adjustment film.

8. The method for fabricating a nonvolatile semiconductor memory device according to claim 1, wherein the third step includes a first ion injection step performed on the active region beside one side surface of the gate structure and a second ion injection step performed on the active region beside the other side surface of the gate structure.

9. The method for fabricating a nonvolatile semiconductor memory device according to claim 8, wherein the first ion injection step or the second ion injection step includes a step of injecting at least two types of impurity ions having an opposing conductivity type to the conductivity type of the semiconductor substrate.

10. The method for fabricating a nonvolatile semiconductor memory device according to claim 8, wherein the first ion injection step or the second ion injection step includes a step of injecting impurity ions having a same conductivity type as the conductivity type of the semiconductor substrate and impurity ions having a conductivity type opposite to the conductivity type of the semiconductor substrate.

11. The method for fabricating a nonvolatile semiconductor memory device according to claim 1, wherein the second step includes a step of masking each ion injection adjustment film on one side surface of the gate structure while exposing each ion injection adjustment film on the other side surface of the gate structure, and a step of performing anisotropic etching of each ion injection adjustment film being exposed on said other side surface of the gate structure.

12. The method for fabricating a nonvolatile semiconductor memory device according to claim 11, wherein the second step includes a step of adjusting the film thickness of each ion injection adjustment film by etching after anisotropic etching.

13. The method for fabricating a nonvolatile semiconductor memory device according to claim 1, wherein the first step includes a step of forming a protective insulation film on the control gate electrode.

14. The method for fabricating a nonvolatile semiconductor memory device according to claim 1, wherein, after the fourth step, said method further includes a fifth step of forming insulative side wall spacers on the side surfaces of said gate structure with the ion injection adjustment films interposed therebetween, and a sixth step of injecting into the semiconductor substrate impurity ions having a conduction type opposite to a conduction type of the semiconductor substrate by using the gate structure, the ion injection adjustment films and the insulative side wall spacers as masks.

15. The method for fabricating a nonvolatile semiconductor memory device according to claim 1, wherein each ion injection adjustment film is formed by silicon nitride in the second step.

16. The method for fabricating a nonvolatile semiconductor memory device according to claim 1, wherein, the second step of forming each ion injection adjustment film comprises a step of forming a first adjustment film comprising silicon oxide; and a step of forming a second adjustment film comprising silicon nitride on the first adjustment film.

17. The method for fabricating a nonvolatile semiconductor memory device according to claim 16, wherein the second step includes a step of removing a lower end portion of the second adjustment film after forming the second adjustment film.

* * * * *